United States Patent [19]

Young

[11] Patent Number: 5,622,789

[45] Date of Patent: Apr. 22, 1997

[54] BATTERY CELL HAVING AN INTERNAL CIRCUIT FOR CONTROLLING ITS OPERATION

[75] Inventor: Steven J. Young, Milpitas, Calif.

[73] Assignee: Apple Computer, Inc., Cupertino, Calif.

[21] Appl. No.: 310,802

[22] Filed: Sep. 12, 1994

[51] Int. Cl.[6] .............................. H01M 2/20; H01M 2/22; H01M 2/30

[52] U.S. Cl. .................................. 429/7; 429/62; 320/35; 320/37; 320/38

[58] Field of Search .................................. 429/7, 49, 61, 429/62; 320/21, 27, 37, 38, 39

[56] References Cited

U.S. PATENT DOCUMENTS

| | | |
|---|---|---|
| 3,108,192 | 10/1963 | Reich . |
| 3,546,024 | 12/1970 | Niklas ..................................... 136/182 |
| 4,140,957 | 2/1979 | Rapp . |
| 4,296,461 | 10/1981 | Mallory et al. ............................ 363/22 |
| 4,992,340 | 2/1991 | Tidwell et al. ............................. 429/7 |
| 5,028,806 | 7/1991 | Stewart et al. . |
| 5,124,508 | 6/1992 | DuBrueq ................................. 174/260 |
| 5,200,685 | 4/1993 | Sakamoto . |
| 5,237,258 | 8/1993 | Crampton . |
| 5,270,946 | 12/1993 | Shibasaki et al. . |
| 5,287,053 | 2/1994 | Hutchinson . |
| 5,300,874 | 4/1994 | Shimamoto et al. . |
| 5,411,816 | 5/1995 | Patino ......................................... 429/7 |

Primary Examiner—Stephen Kalafut
Assistant Examiner—Carol Chaney
Attorney, Agent, or Firm—Blakely, Sokoloff, Taylor & Zafman

[57] ABSTRACT

A battery cell having a positive terminal, a negative terminal and a power producing core section (e.g., electrolyte) for systems, such as computer systems, cellular phones, etc. The battery cell also includes an internal circuit to monitor the state of the battery cell. The state that is monitored may include the temperature, charge level of the battery core section, the discharge/charge rate. The circuit may control the battery cell (e.g., cause charging of the battery cell). This internal circuit may be an integrated circuit, such as a microprocessor.

25 Claims, 3 Drawing Sheets

BATTERY CELL HAVING AN INTERNAL CIRCUIT FOR CONTROLLING ITS OPERATION

FIELD OF THE INVENTION

The present invention relates to the field of battery power; more particularly, the present invention relates to battery cells that include a control mechanism within the cell for monitoring and charging the cell.

BACKGROUND OF THE INVENTION

Today, batteries are used to provide power to many devices. These devices are more often portable or mobile devices. More recently, batteries have been a primary power source used for laptop and notebook computers, cellular phones, hand-held/mobile video recorders and many other electronic devices. Current battery cells include nickel cadmium, nickel metal hydride, lithium-ion, alkaline, acid, zinc, etc.

Typically, a group of batteries are strung together and encased in a plastic-molded pack. The cells in a pack are strung together by electrically coupling the positive terminal of one battery to the negative terminal of the next battery, with the negative terminal of the first battery in the string being the negative contact of the battery pack and the positive terminal of the last battery in the string being the positive contact of the battery pack. The plastic battery pack may also contain a logic board (e.g., PCB) that contains an integrated circuit (IC), an analog-to-digital (A/D) converter and/or a serial communication device to monitor the state of the battery pack and provide access to the state by a unit external to the battery pack. However, this logic board does not monitor each cell independently, only the group of battery cells as a whole. A temperature sensor may also be included in the battery pack to determine the temperature within the battery pack. The temperature reading obtained using the temperature sensor is output from the battery pack along with the positive and negative contacts of the first and last batteries in the string respectively.

One problem with current battery packs of the prior art is their expense. Specifically, approximately 20% of the cost of a battery pack is due to the molded plastic used to encase the battery cells. The plastic is normally custom molded for use in a specific application, such that there is no interchangeability between the various battery packs. For example, a battery pack designed for use in a specific laptop or notebook computer, normally cannot be used in other computers. This is due in part to the necessary functionality that is included within the battery packs to monitor and control the batteries as a whole. It is desirable to add some interchangeability to the battery packs. By integrating monitoring and control functionality into the battery cells themselves, the circuit board within a battery pack may be eliminated, thereby leaving only the battery cells in the battery pack. With cells of a particular type being approximately the same size, the battery packs can be the same size and interchangeable for different applications.

Another problem with the battery packs of the prior art is that they do not provide charging of individual cells. The entire string of batteries in the battery pack is coupled up to a charger in order to charge the battery pack as a whole. Cells within the inner portion of a string of batteries are not monitored individually, such that there is no method of guaranteeing that these inner cells are fully changed without always overcharging.

The battery packs of the prior art do not provide for monitoring of individual cells. Because individual cells are not monitored, the user has no way of knowing the current charge level of individual cells in the pack or that a battery cell in the pack is damaged. Charging a damaged cell may be dangerous because the cell may vent, become very hot, do nothing, or explode. Thus, without the ability to monitor, the user may be put in danger when attempting to charge the battery pack. Moreover, without monitoring, difficulty exists in maintaining a cell's charging within its optimum operating range. For instance, certain cells, such as lithium-ion cells, operate when they are charged to a particular range. If they are over-charged, they explode. If they are discharged too low, then they cannot be charged again. Because there is no monitoring in the prior art of individual cells, one cannot determine if one of the cells in the pack has become over-charged, such that it may explode, or has become discharged too low, such that it cannot be charged again. Therefore, it is desirable to be able to monitor individual battery cells in a battery pack.

Furthermore, because individual cells are not monitored, cells may become unbalanced. When cells become unbalanced, it is possible that a reverse cell voltage could occur. That is, as cells are normally coupled together with the positive terminal connected to the negative terminal of a subsequent battery cell in the string, if a cell becomes discharged too low, a cell reversal may occur. In cell reversal, if the charge in the cell becomes zero volts, the positive and negative designations lose their meaning and terminals of an individual battery cell may switch designations such that the positive terminal and the negative terminal of a zero volt battery cell switch to become negative and positive respectively. In such a situation, the other battery cells start to charge the zero volt cell and place energy into it due to its terminals being connected to the same terminals of its neighboring battery cells. In the prior art, this may occur unknown to the user since there is no monitoring of individual cells in the battery pack. Thus, it is desirable to provide monitoring of individual cells to avoid cell reversal.

The present invention provides a mechanism to monitor and charge each cell independently. In doing so, the present invention eliminates unbalanced cells, reversed cell voltages and provides a mechanism to determine if a cell is damaged to prevent damaged cells from being charged.

SUMMARY OF THE INVENTION

A battery cell having an internal control mechanism is described. The battery cell of the present invention may be incorporated into a battery pack that provides power to systems, such as computer systems, cellular phones, etc.

The battery cell of the present invention comprises a positive terminal, a negative terminal and a power producing core section (e.g., electrolyte). The battery cell also includes an internal circuit to monitor the state of the battery cell. The state that is monitored may include the temperature, charge level of the battery core section, the discharge/charge rate. The circuit may control the battery cell (e.g., cause charging of the battery cell). This internal circuit may be an integrated circuit, such as a microprocessor.

The battery cell of the present invention may include an internal battery charger. The battery charger may operate under control of the internal circuit. In one embodiment, the battery charging circuit may comprise a transistor. The battery cell of the present invention may include a temperature sensor or a current sensor.

The battery cell of the present invention may include a communication bus. Each battery cell could include two bus terminals that are positioned in close proximity to the positive and negative terminals of the battery cell, such that when a group of battery cells are coupled together, the bus terminals are electrically connected to form a single communication bus.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A battery cell for use in a battery pack is described. In the following detailed description numerous specific details are set forth, such as the number of cells in a battery pack, types of battery cells, types of integrated circuits, voltage/charge quantities, etc., in order to provide a thorough understanding of the present invention. However, it will be apparent to one skilled in the art that the present invention may be practiced without these specific details. Also, well-known circuits have been shown in block diagram form, rather than in detail, in order to avoid obscuring the present invention.
Overview of the Present Invention The present invention provides a battery cell that includes a circuit within the sealed battery encasement. This internal circuit provides functionality to the battery cell to allow a battery cell to perform certain functions automatically and independently. The circuit may be an integrated circuit, such as a microprocessor or microcontroller.

One function performed by the internal circuit is to monitor the state of the battery cell. In one embodiment, the circuit may monitor the temperature, the charge rate and the discharge rate. The circuit may also control the charging of the battery cell, coordinating when charging is needed and when current charging of the battery cell should be stopped. By incorporating charging circuitry within the battery cell, the battery cell may be charged independently and internally according to the present invention. Each battery cell may also incorporate temperature sensing capabilities within the battery cell for use in conjunction with charging, as well as incorporating current sensing capabilities to determine the current state of the charge in the battery cell.

In the present invention, each battery cell also may comprise communication capabilities. These communication capabilities allow the state of each cell to be reported to locations external to the battery cell or external to the battery pack. The communication capabilities of each cell may be coupled to communications of other cells in the battery pack to form a single coupled communication system (e.g., a single bus between cells). In one embodiment, a multi-drop single wire bus runs from one end (e.g., the positive terminal) of the battery cell to the other (e.g., the negative terminal). The circuit, (e.g., IC, or microprocessor), is coupled to the single wire bus and can control its use. In this manner, the circuit can cause data corresponding to the state of the battery cell and/or other parameters relevant to batteries to be sent on the bus and can act in response to data received from the single wire bus.

Figure 1:
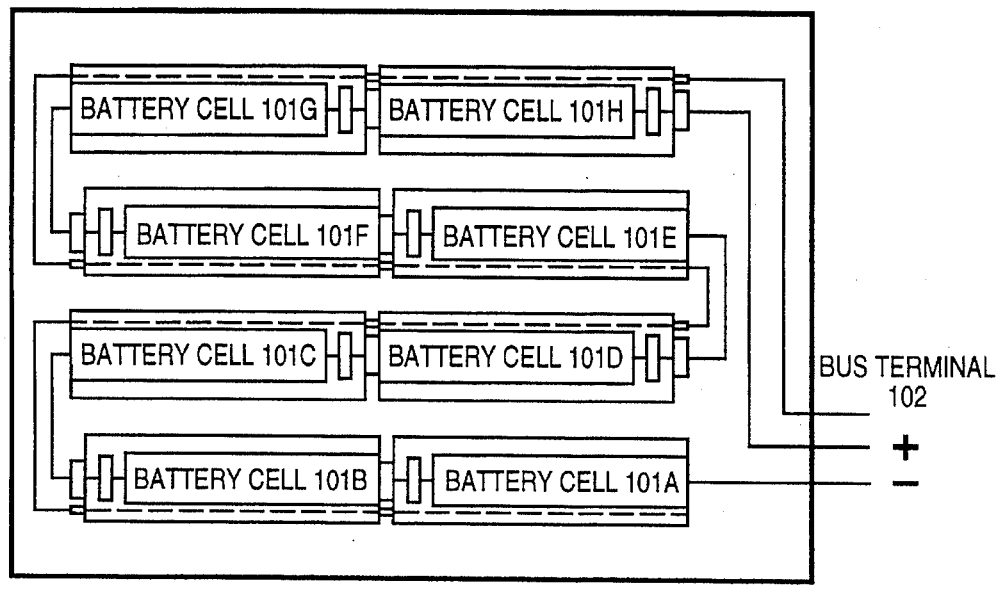
FIG. 1 illustrates one embodiment of a battery pack of the present invention.

FIG. 1 illustrates one embodiment of the battery pack of the present invention. Referring to FIG. 1, standard battery pack 100 is shown having eight batteries 101A–H strung together with the positive terminal of one battery electrically coupled to the negative terminal of the following battery, except with the negative contact of the battery pack being the negative terminal of the first battery in the string and the positive contact of the battery pack being electrically coupled to the positive terminal of the last battery in the string. Jumper wires may be included to fully connect all of the terminals of battery cells to each other. Also shown as an output of the battery pack 100 is a data communication bus, in the forms of bus terminal 102.

The eight batteries are encapsulated in plastic or other housing material 104 in a manner well-known in the art. The plastic housing may be molded into a shape designed for receipt into a slot in the side of a computer system, cellular phone, or other similar type of battery-packed operated system. The battery cells may comprise nickel cadmium (NiCd) battery cells, nickel metal hydride battery cells, lithium-ion battery cells, alkaline battery cells, acid battery cells, zinc battery cells, etc.

Figure 2:
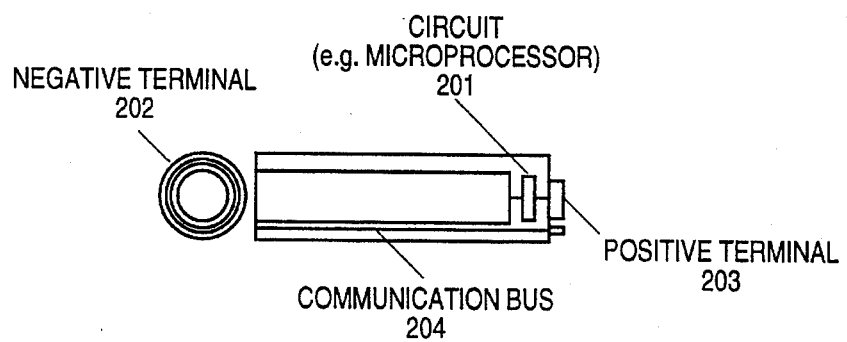
FIG. 2 illustrates a section view of a battery cell of the present invention.

FIG. 2 illustrates a side view of a battery cell of the present invention. The left section view illustrates an inner connector to the battery cell representing the negative terminal surrounded by an insulator. In one embodiment, a battery winding is coupled to the negative terminal. The other end of the battery winding is coupled to a circuit within the battery cell. Also coupled to the circuit is the positive terminal (e.g., button) of the battery cell. Also in one embodiment, the circuit is a K-9 processor manufactured by Motorola Corporation of Schaumberg, Ill.

The circuit of the present invention is responsible for monitoring the state of the battery cell and charging the battery cell at the desired time. The circuit may be on a circuit board or substrate. The power plane of such a board or substrate is coupled to the positive lead from the battery cell's core section. This power plane then serves as the output to the positive terminal of the battery cell. In another embodiment, the current board or substrate could be connected to the positive output in a non-serial fashion.

Also shown as line 204 in FIG. 2 is a data communication bus running from the negative terminal side of the battery cell to the positive terminal side of the battery cell. The communication bus 204 may comprise a coaxial with a coaxial connector at the terminal. The use of communication bus 204 will be described later below.

Figure 3:
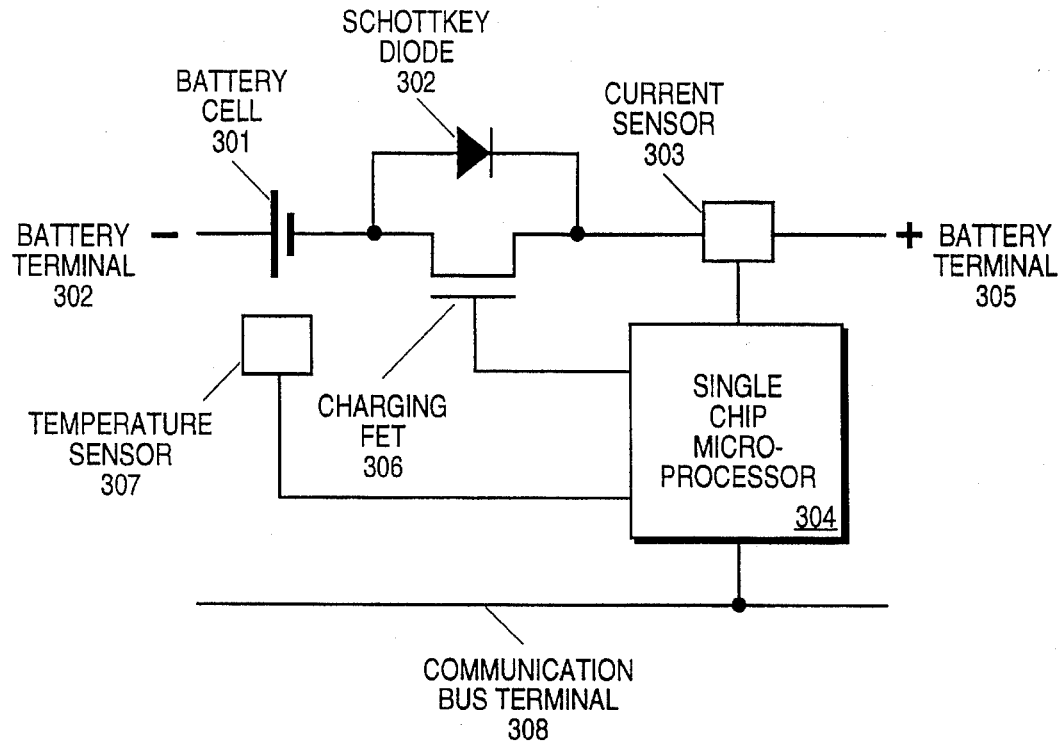
FIG. 3 is one embodiment of a circuit schematic of a battery cell according to the present invention.

FIG. 3 illustrates a circuit schematic of the battery cell of the present invention. Referring to FIG. 3, a negative battery terminal 300 is coupled to the one side of battery cell core 301. The positive terminal side of battery cell core 301 is coupled to an input of Schottkey diode 302. The output of the Schottkey diode 302 is coupled to current sensor 303. The current sensor 303 is also coupled to single chip processor 304 and the positive battery terminal 305. The positive terminal side of the battery cell core 301 is also coupled to a source of a charging field effect transistor (FET) 306. The drain of the charging FET 306 is coupled to the current sensor 303 and the output of Schottkey diode 302, while the gate of the charging FET 306 is coupled to and controlled by the single chip processor 304. Also coupled to single chip processor 304 is a temperature sensor 307 and a communication bus 308. All of these items are coupled together on a small circuit board or on a silicon substrate.

In one embodiment, where the battery comprises a NiCd battery, battery cell core 301 comprises a positive electrode and a negative electrode separated by separators. The positive electrode, negative electrode and separators are rolled into a winding with a core inserted at the center to form an electrolyte. Note that although not shown to avoid obscuring the present invention, the electrolyte is sealed and insulated from the remainder of the battery.

The Schottkey diode 302 provides the path for current travel through the battery cell to be output from the battery cell 300 at the positive terminal 305. Diode 302 prevents current from traveling in the opposite direction through the battery cell 300.

Current sensor 303 measures the current traveling through the battery cell 300. Microprocessor 304 activates current sensor 303 to obtain the current discharge or charge rates of the battery cell core 301. In one embodiment, current sensor 303 comprises a resistor (e.g., a transistor), and the current is sensed by measuring the voltage across the resistor in a manner well-known in the art.

Temperature sensor 303 measures the temperature of the battery cell core 301. In one embodiment, temperature sensor 303 is the resistor that is coupled within the battery cell in the same well-known manner temperature sensors are coupled to the external positive and negative contacts of a battery in the art.

In one embodiment, processor 304 includes a clock for timing operations, an A/D converter for reading the temperature of battery cell and the current produced by the battery cell core 301 and to convert that information into a form capable of being carried on the communication bus 308. Processor 304, operating under the direction of software, controls the internal operation of the battery. The processor 304 also includes circuitry to turn on and off input/output (I/O) bits for use in controlling the internal functionality, such as the bits to turn off charging FET 306. In one embodiment, the processor 304 of the present invention is a K-9 processor from Motorola Corporation of Schaumberg, Ill.

The processor 304 uses software to control operations in the battery cell. For instance, using software contained stored on-board, such as in a read-only memory (ROM), the processor controls the charging of the battery cell. By determining the current that is in the battery cell, the processor 304 is able to determine when the battery cell should be charged. For instance, processor 304 may cause the battery cell to be charged when the current output falls below some predetermined level indicative of its charge level. That is, based in the output of the battery, the processor 304 may initiate charging of the battery to occur. Using the temperature sensor, the processor is able to determine when the battery has been charged to a full state.

Note that the processor is operated by the battery. However, this produces only an insignificant drain on the battery cell power and the processor is able to turn off the battery cell long before it reaches too low of a charged state.

The processor is able to obtain the internal state of the battery cell. By knowing the state, and supplying the state as an output on the communication bus 308, battery cell parameters may be read. Optionally, the battery cell may include indicators (e.g., lights) to signal a state of the battery cell device.

Using the communication bus 308, new software for the processor may be downloaded into the processor from an external source. The new software could change the charging characteristics of the battery over time. Furthermore, the processor can be programmed not to charge the battery where the user of the battery pack is using an external charger to charge the battery cells in the battery pack.

The communication bus 308 also provides the battery cell of the present invention with communication capabilities throughout the battery pack. Each battery cell includes a communication bus having two terminals, one located at the end of the negative terminal and one at the end of the positive terminal, so that the battery cell can be coupled to another battery cell's communication bus when the battery cells are strung together (such as when the positive and negative battery terminals are coupled together). This extra conductor in the battery acts as a serial bus and allows multiple batteries to be connected as a signal bus. In one embodiment, the communication bus is a multi-drop wire bus.

The processor in each battery cell sits as a device on the bus. By providing a data communication bus, another device in the system, such as the main processor in a computer system, can interrogate individual battery cells and obtain information. For instance, using the communication bus, another device can receive information indicating if the battery is bad, or the currently charge level of the battery (e.g., 50%, 70%, 80%, etc.) or other information regarding the battery cell itself. Note that the external device may be a device in the battery pack itself acting as a master for the battery pack to control its operations.

Applications

The battery cell of the present invention may be integrated into battery packs for use in many applications. For instance, the present invention may be used in cellular phone, portable/hand-held video recorders and camcorders and computers. An exemplary computer system is described in FIG. 4.

Figure 4:
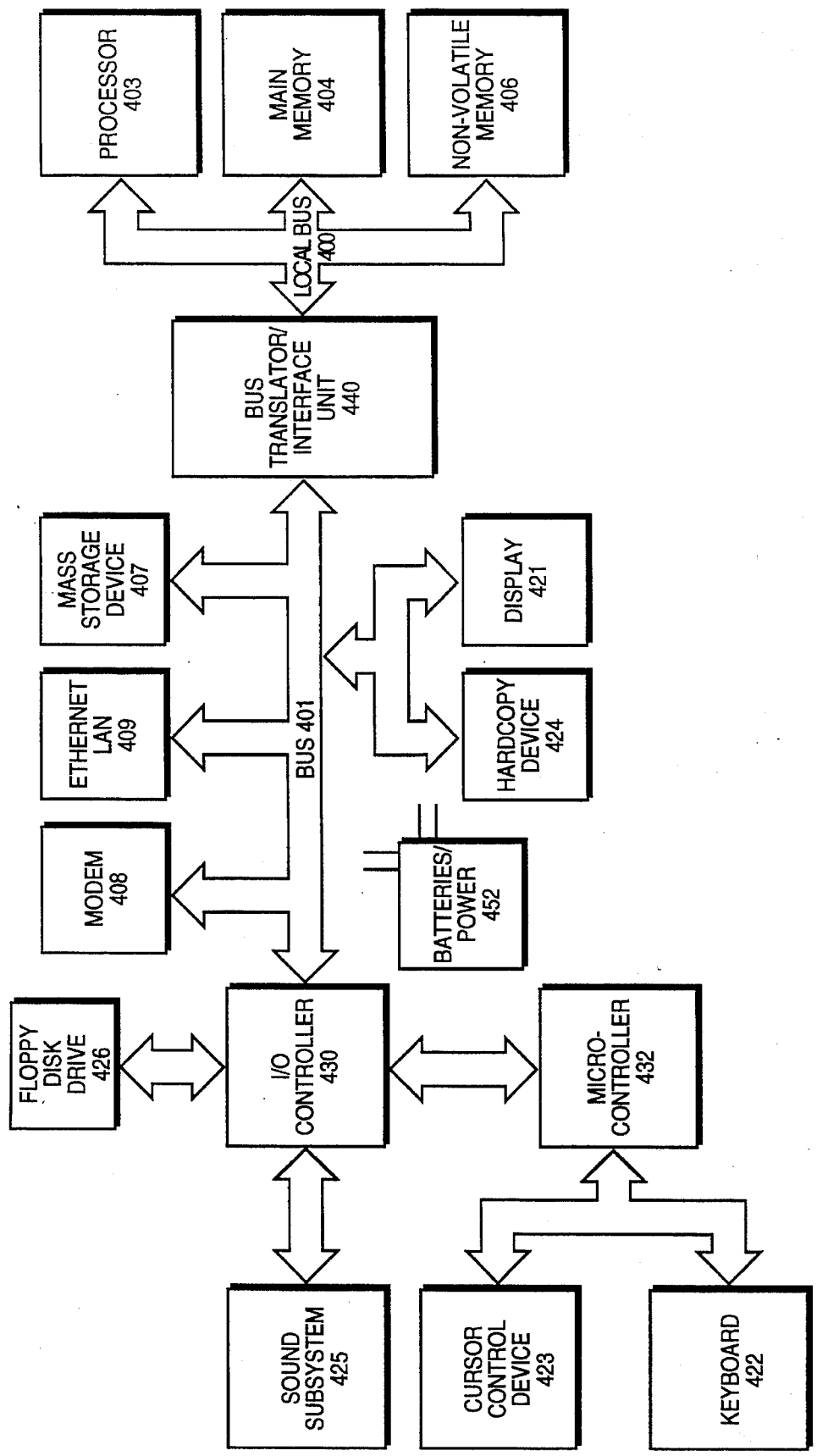
FIG. 4 is a block diagram of one embodiment of a computer system of the present invention.

Referring to FIG. 4, an overview of a computer system of the present invention is shown in block diagram form. The present invention may be implemented on a general purpose microcomputer, such as one of the members of the Apple PowerBook™ family, one of the members of the IBM personal computer family, or one of several audio computer devices which are presently commercially available. Of course, the present invention may also be implemented on a multi-user system while encountering all of the costs, speed, and function advantages and disadvantages available with these machines. The preferred embodiment of the present invention is implemented on an Apple PowerBook™ computer system developed by the assignee of the present invention.

As illustrated in FIG. 4, the computer system of the present invention generally comprises a local bus or other communication means 400 for communicating information, a processor 403 coupled with local bus 400 for processing information, a random access memory (RAM) or other dynamic storage device 404 (commonly referred to as a main memory) coupled with local bus 400 for storing information and instructions for processor 403, and a read-only memory (ROM) or other non-volatile storage device 406 coupled with local bus 100 for storing non-volatile information and instructions for processor 403.

The computer system of the present invention also includes an input/output bus or other communication means 401 for communicating information in the computer system. A data storage device 407, such as a magnetic tape and disk drive, including its associated controller circuitry, is coupled with I/O bus 401 for storing information and instructions. A display device 421, such as a cathode ray tube, liquid crystal display, etc., including its associated controller circuitry, is coupled to bus 401 for displaying information to the computer user, as well as a hard copy device 424, such as a plotter or printer, including its associated controller circuitry, for providing a visual representation of the computer images. Hard copy device 424 is coupled with processor 403, main memory 404, non-volatile memory 406 and mass storage device 407 through I/O bus 401 and bus translator/ interface unit 440. A modem 408 and an ethernet local area network 109 are also coupled to I/O bus 401.

Bus interface unit 440 is coupled to local bus 400 and I/O bus 401 and acts a gateway between processor 403 and the I/O subsystem. Bus interface unit 440 may also provide translation between signals being sent from units on one of the buses to units on the other bus to allow local bus 100 and I/O bus 401 to co-operate as a single bus.

An input/output (I/O) controller 430 is coupled to I/O bus 401 and controls access to certain I/O peripherals in the computer system. For instance, I/O controller 430 is coupled to controller device 432 that controls access to an alpha-numeric input device 422 including alpha-numeric and other keys, etc., for communicating information and command selections to processor 403, and a cursor control 423, such as a trackball, stylus, mouse, or trackpad, etc., for controlling cursor movement. The system also includes a sound subsystem 425 coupled to I/O controller 430 for providing audio recording and play back. Sound subsystem 425 may include a sound circuit and its driver which are used to generate various audio signals from the computer system and may further include a path through which the modem 408 can make sounds. I/O controller 430 may also provide access to a floppy disk and driver 426. The processor 403 controls I/O controller 430 with its peripherals by sending commands to I/O controller 430 through buses 400 and 401, and bus interface unit 440.

Batteries or other power supply 452 may also be included to provide power necessary to run the various peripherals and integrated circuits in the computer system. Power supply 452 is typically a DC power source that provides a constant DC power to various units, particularly processor 403. Various units such as processor 403, display 421, etc., also receive clocking signals to synchronize operations within the computer systems. These clocking signals may be provided by a global clock generator or multiple clock generators, each dedicated to a portion of the computer system.

In one embodiment, processor 403 is a 68000 brand processor, such as the 68040 processor manufactured by Motorola Corporation of Schaumberg, Ill. The memory in the computer system is initialized to store the operating system as well as other programs, such as file directory routines and application programs, and data inputted from I/O controller 430. In the preferred embodiment, the operating system is stored in ROM 406, while RAM 404 is utilized as the internal memory for the computer system for accessing data and application programs. Processor 403 accesses memory in the computer system via an address bus within local bus 400. Commands in connection with the operation of memory in the computer system are also sent from the processor 403 to the memory using local bus 400. Local bus 400 also includes a bi-directional data bus to communicate data in response to the commands provided by processor 403 under the control of the operating system running on it.

Of course, certain implementations and uses of the present invention may neither require nor include all of the above components. For example, in certain implementations a keyboard or cursor control device for inputting information to the system may not be required. In other implementations, it may not be required to provide a display device displaying information. Furthermore, the computer system may include additional processing units, or buses 400 and 401 may be combined (collapsed into one bus) without the need for bus translator interface unit 440.

The present invention provides a number of advantages over the prior art. For instance, the teachings of the present invention may be applied to various battery types, and thus, are independent of the battery technology used. For instance, the teachings of the present invention may be utilized in batteries, such as acid, alkaline, zinc, lithium-ion, nickel cadmium, nickel metal hydride batteries, etc. Furthermore, the present invention provides battery intelligence communications that allow the state of the battery cell or other parameters relevant to batteries to be made externally available. That is, the state of a battery cell may be interrogated and read by a device external to the battery cell or the battery pack. In this manner information may be obtained to determine if a battery is bad or has low charge, thereby acting as a gas gauge of the remaining energy. Because the state of the battery is available, the present invention allows the battery life to be extended due to the constant monitoring of its capacity. That is, the processor of the present invention may be programmed to monitor the battery cell and know when to stop its charging in order to obtain the maximum battery life. By recording the number of charge/discharge cycles, the battery life may also be ascertained. This permits the age of the cell to be obtained, if needed. A performance benefit may be provided where the charge/discharge cycle is available, and through the use of software in the battery cell, can be manipulated such that an increased or decreased charge is known to be available in the battery cell. Moreover, because the state of the battery cell is available externally, the present invention can avoid unbalanced cells by not allowing the devices to discharge too far or be programmed too high. Because there are no unbalanced cells, there will be no cell reversals. Furthermore, the processors can be programmed to disconnect or turn-off a battery cell when a dangerous condition is known to exist (by monitor for that condition).

The present invention also provides a battery cell with its own charger. In this case, no external charger is needed and the charging is controlled through software on the integrated circuit in the battery cell itself. Note that an external power source is required. Furthermore, with respect to charging, the present invention allows temperature monitoring of each cell. This is particularly advantageous with respect to charging as the processor within the battery cell can determine when the cell has completed charging by noting the increase in the temperature. Also, the processor on board can determine when a battery cell should not be charged, such as when its temperature is greater than 50° C.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, a battery cell for use in an electronic system has been described.

I claim:

1. A battery cell comprising:

a positive terminal;

a negative terminal;

a battery cell core coupled to the negative terminal and positive terminal to provide power externally using the positive terminal and the negative terminal;

a circuit coupled to the battery cell core to monitor the battery cell state;

a bus coupled to the circuit and having separate bus terminals at both the positive and negative terminals to communicate conditions of the battery cell core; and a charging device coupled to the battery cell core to charge the battery cell core.

2. The battery cell defined in claim 1 wherein the circuit comprises a processor.

3. The battery cell defined in claim 1 wherein the charging device comprises a transistor.

4. The battery defined in claim 1 wherein the bus comprises a wire bus to transfer communications between the circuit and a location external to the battery.

5. The battery cell defined in claim 1 wherein the circuit is coupled to and controls the charging device.

6. A battery cell comprising:

a positive terminal;

a negative terminal;

a battery cell core coupled to the negative terminal and positive terminal to provide power externally using the positive terminal and the negative terminal;

a circuit coupled to the battery cell core to monitor the battery cell state;

a wire bus having separate bus terminals at both the positive and negative terminals to transfer communications between the circuit and a location external to the battery.

7. The battery cell defined in claim 6 wherein the circuit comprises a processor.

8. The battery cell defined in claim 6 further comprising a temperature sensor that measures temperature of the battery cell core and a current sensor that measures current travelling through the battery cell core, and wherein the circuit is coupled to the temperature sensor and the current sensor and converts information received therefrom into a form for transfer.

9. A battery pack comprising:

a plurality of batteries, wherein each of the plurality of batteries includes
a positive terminal at a first end,
a negative terminal at a second end,
a first bus terminal at the first end, and
a second bus terminal at the second end,
and a communication mechanism coupled to the first bus terminal and the second bus terminal, and further wherein the plurality of batteries are coupled together in a serial chain, such that a communication bus is formed; and a package encasing the plurality of batteries, wherein battery contacts of two of the plurality of batteries exit the package to provide power therefrom.

10. The battery defined in claim 9 wherein the package includes a bus terminal coupled to one of either the positive terminal or the negative terminal.

11. The battery defined in claim 9 wherein each of the plurality of batteries further comprises a circuit coupled to the communication mechanism to monitor the state of said each of the plurality of batteries.

12. The battery defined in claim 11 wherein the control device comprises a processor.

13. The battery defined in claim 9 wherein at least one of the plurality of batteries includes a charging mechanism to charge said one of the plurality of batteries.

14. The battery defined in claim 13 wherein the charging mechanism comprises a transistor.

15. A system comprising:

a plurality of electronic devices coupled together to provide at least one function;

a battery pack coupled to provide power to the plurality of electronic devices, wherein the battery pack comprises
a battery cell having:
a positive terminal;
a negative terminal;
a battery cell core coupled to the negative terminal and the positive terminal to provide power externally therefrom using the positive terminal and the negative terminal;
an internal communication bus having separate bus terminals at the positive and negative terminals to transfer information between the battery cell and at least one of the plurality of electronic devices; and
a circuit coupled to the battery cell core to monitor the battery cell state.

16. The system defined in claim 15 wherein said one of the plurality of electronic devices obtains state information from the battery cell and programs the circuit in the battery cell based on the state information.

17. The system defined in claim 15 wherein the plurality of electronic devices comprises a processor, a memory and a bus coupling the processor and the memory.

18. A battery cell comprising:

a positive terminal;

a negative terminal;

a battery cell core coupled to the negative terminal and positive terminal to provide power externally using the positive terminal and the negative terminal;

an integrated circuit coupled to the battery cell core to monitor the battery cell state;

a bus with separate bus terminals at both the positive and negative terminals to transfer communications between the circuit and a location external to the battery.

19. A battery pack comprising:

a plurality of batteries, wherein each of the plurality of batteries includes
a positive terminal at a first end,
a negative terminal at a second end,
a first bus terminal at the first end, and
a second bus terminal at the second end,
and a communication bus coupled to the first bus terminal and the second bus terminal, and further wherein the bus terminals of the plurality of batteries are coupled to form a single bus; and a package encasing the plurality of batteries, wherein a battery contact of each of two of the plurality of batteries exit the package to provide power therefrom.

20. The battery defined in claim 19 wherein the communication bus comprises a wire bus.

21. The battery defined in claim 19 wherein the package includes a bus terminal coupled to one of either the first bus terminal or the second bus terminal of one of the plurality of batteries.

22. The battery defined in claim 19 wherein each of the plurality of batteries further comprises a control device coupled to the communication bus to monitor said each of the plurality of batteries.

23. The battery defined in claim 22 wherein the control device comprises a processor.

24. The battery defined in claim 19 wherein at least one of the plurality of batteries includes a charging mechanism to charge itself.

25. The battery defined in claim 24 wherein the charging mechanism comprises a transistor.

* * * * *